US009922819B2

(12) United States Patent
Balasubramanian et al.

(10) Patent No.: US 9,922,819 B2
(45) Date of Patent: Mar. 20, 2018

(54) WAFER ROTATION IN A SEMICONDUCTOR CHAMBER

(71) Applicant: Applied Materials, Inc., Santa Clara, CA (US)

(72) Inventors: Ganesh Balasubramanian, Sunnyvale, CA (US); Juan Carlos Rocha-Alvarez, San Carlos, CA (US); Ramprakash Sankarakrishnan, Santa Clara, CA (US); Robert Kim, San Francisco, CA (US); Dale R. Du Bois, Los Gatos, CA (US); Kirby H. Floyd, San Jose, CA (US); Amit Kumar Bansal, Milpitas, CA (US); Tuan Anh Nguyen, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/435,189

(22) Filed: Feb. 16, 2017

(65) Prior Publication Data
US 2017/0162385 A1    Jun. 8, 2017

Related U.S. Application Data

(62) Division of application No. 14/632,648, filed on Feb. 26, 2015, now Pat. No. 9,593,419.
(Continued)

(51) Int. Cl.
*H01L 21/67* (2006.01)
*H01L 21/02* (2006.01)
(Continued)

(52) U.S. Cl.
CPC .... *H01L 21/02274* (2013.01); *C23C 16/4584* (2013.01); *C23C 16/4585* (2013.01);
(Continued)

(58) Field of Classification Search
CPC . H01L 21/02; H01L 21/022; H01L 21/02274; H01L 21/76; H01L 21/68764;
(Continued)

(56) References Cited

U.S. PATENT DOCUMENTS

| 5,370,739 A | 12/1994 | Foster et al. |
| 5,879,128 A * | 3/1999 | Tietz ................. H01L 21/68742 |
| | | 414/757 |

(Continued)

FOREIGN PATENT DOCUMENTS

KR    10-2009-0078980 A    7/2009

OTHER PUBLICATIONS

International Search Report and Written Opinion for International Application No. PCT/US2015/016199 dated May 29, 2015.

*Primary Examiner* — Chuong A Luu
(74) *Attorney, Agent, or Firm* — Patterson + Sheridan LLP

(57) ABSTRACT

A method and apparatus for processing a substrate are provided. The apparatus includes a pedestal and rotation member, both of which are moveably disposed within a processing chamber. The rotation member is adapted to rotate a substrate disposed in the chamber. The substrate may be supported by an edge ring during processing. The edge ring may selectively engage either the pedestal or the rotation member. In one embodiment, the edge ring engages the pedestal during a deposition process and the edge ring engages the rotation member during rotation of the substrate. The rotation of the substrate during processing may be discrete or continuous.

20 Claims, 9 Drawing Sheets

Related U.S. Application Data

(60) Provisional application No. 61/951,920, filed on Mar. 12, 2014.

(51) Int. Cl.
  *C23C 16/458* (2006.01)
  *C23C 16/505* (2006.01)
  *H01J 37/32* (2006.01)
  *H01L 21/687* (2006.01)

(52) U.S. Cl.
  CPC ...... *C23C 16/505* (2013.01); *H01J 37/32082* (2013.01); *H01J 37/32568* (2013.01); *H01J 37/32724* (2013.01); *H01J 37/32743* (2013.01); *H01L 21/67103* (2013.01); *H01L 21/68735* (2013.01); *H01L 21/68764* (2013.01); *H01J 2237/3321* (2013.01)

(58) Field of Classification Search
  CPC ......... H01L 21/68735; H01L 21/67103; H01L 21/68742; H01L 21/68792
  USPC ........................................................ 438/782
  See application file for complete search history.

(56) References Cited

U.S. PATENT DOCUMENTS

| | | | |
|---|---|---|---|
| 6,120,609 | A | 9/2000 | Selyutin et al. |
| 6,171,453 | B1 | 1/2001 | Chung et al. |
| 6,338,756 | B2 | 1/2002 | Dietze |
| 6,770,146 | B2 | 8/2004 | Koren et al. |
| 7,449,071 | B2 | 11/2008 | Aggarwal et al. |
| 2004/0231599 | A1 | 11/2004 | Schwambera et al. |
| 2007/0295272 | A1 | 12/2007 | Padhi et al. |
| 2009/0142512 | A1 | 6/2009 | Forster et al. |
| 2009/0208853 | A1* | 8/2009 | Sakamoto ............ G02B 5/201 430/7 |
| 2010/0224130 | A1 | 9/2010 | Smith et al. |
| 2011/0283940 | A1 | 11/2011 | Jhong et al. |
| 2012/0145080 | A1 | 6/2012 | Park et al. |
| 2013/0084390 | A1* | 4/2013 | Suzuki ................ G02B 21/241 427/248.1 |

\* cited by examiner

WAFER ROTATION IN A SEMICONDUCTOR CHAMBER

CROSS-REFERENCE TO RELATED APPLICATIONS

This application is a divisional of U.S. patent application Ser. No. 14/632,648, filed Feb. 26, 2015, now U.S. Pat. No. 9,593,419 which claims benefit to U.S. Provisional Patent Application No. 61/951,920, filed Mar. 12, 2014, both of which are herein incorporated by reference in their entirety.

BACKGROUND

Field

Embodiments described herein generally relate to apparatus and methods for processing a substrate. More specifically, embodiments described herein relate to substrate rotation in a semiconductor chamber.

Description of the Related Art

Semiconductor device performance is determined by a variety of factors. One factor of importance is the uniformity of films deposited on a substrate. It is desirable to deposit films uniformly such that thickness variation is minimized across the surface of the substrate. For example, it may be desirable to form films having thickness variation of less than about 5% across the surface of the substrate.

However, film uniformity may be adversely affected by several factors, including heater temperature, chamber geometry, process gas flow non-uniformity, and plasma non-uniformity, among others. These factors may result in the deposition of non-uniform films on the surface of the substrate, which may ultimately reduce device performance.

Therefore, there is a need in the art for apparatus and methods to improve film uniformity in semiconductor processing.

SUMMARY

In one embodiment, an apparatus for processing a substrate is provided. The apparatus includes a chamber body and a faceplate which define a processing volume. A pedestal may be moveably disposed within the processing volume and a rotation member may also be moveably disposed within the processing volume. The rotation member may be disposed radially outward from the pedestal. An edge ring, which may be configured to support a substrate, may be adapted to selectively interface with either the pedestal or the rotation member.

In another embodiment, a method of processing a substrate is provided. The method includes depositing a first portion of a film on a substrate in a first position. The deposition of the first portion of the film may then be stopped and the substrate may be rotated from the first position to a second position which is different from the first position. A second portion of the film may then be deposited on the substrate in the second position.

In yet another embodiment, a method of processing a substrate is provided. The method includes positioning a substrate on an edge ring disposed in a processing chamber, contacting the edge ring with a pedestal, elevating the pedestal to a processing position, and depositing a film on the substrate. The edge ring may be contacted with a rotation member, the pedestal may be lowered from the processing position, and the rotation member may be rotated.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

A method and apparatus for processing a substrate are provided. The apparatus includes a pedestal and rotation member, both of which are moveably disposed within a processing chamber. The rotation member is adapted to rotate a substrate disposed in the chamber. The substrate may be supported by an edge ring during processing. The edge ring may selectively engage either the pedestal or the rotation member. In one embodiment, the edge ring engages the pedestal during a deposition process and the edge ring engages the rotation member during rotation of the substrate. The rotation of the substrate during processing may be discrete or continuous.

Figure 1:
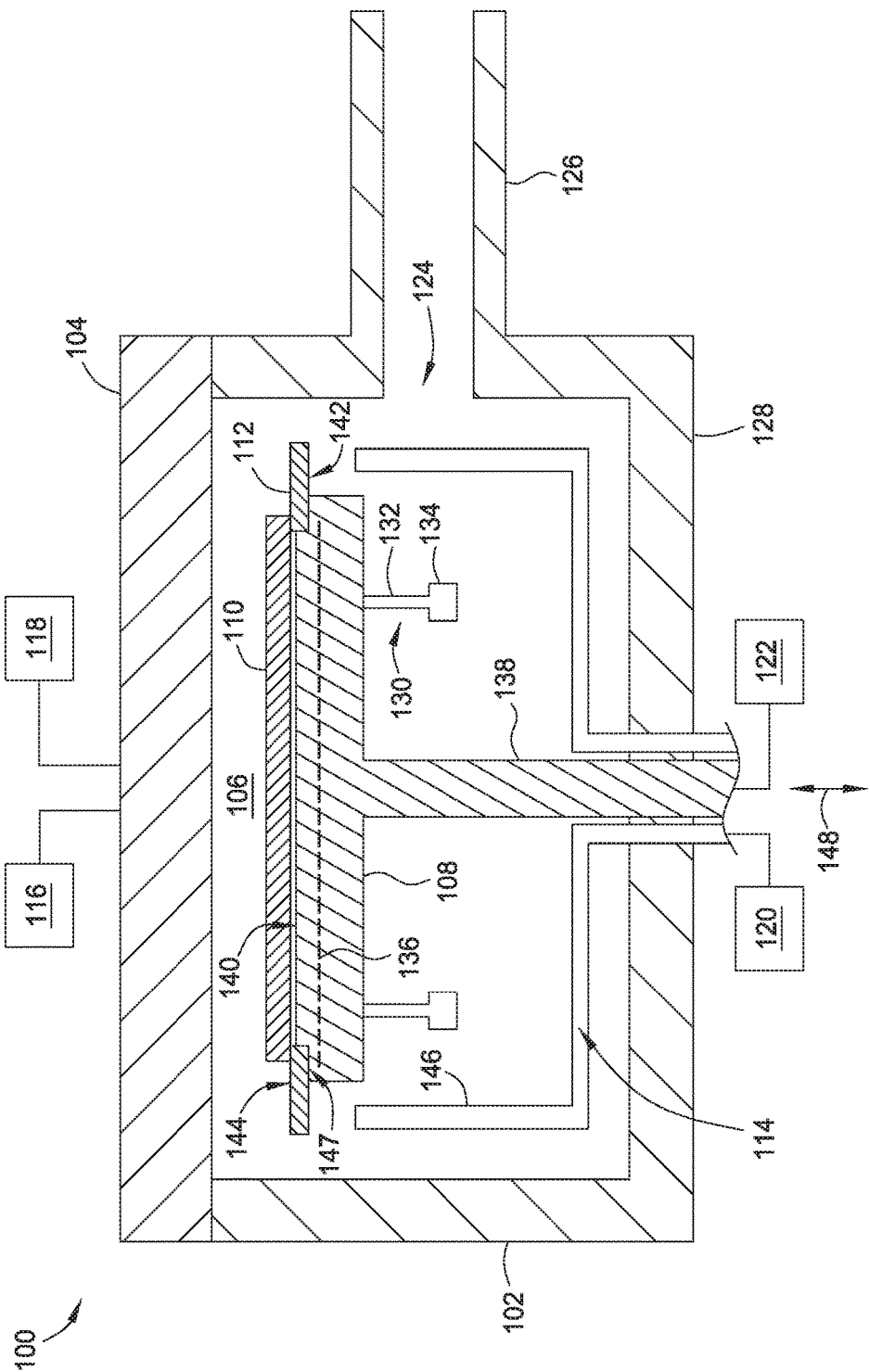
FIG. 1 illustrates a schematic, cross-sectional view of a processing chamber according to one embodiment.

FIG. 1 illustrates a schematic, cross-sectional view of a processing chamber 100. The processing chamber 100 includes a chamber body 102 and a faceplate 104 which define a processing volume 106. A pedestal 108 and a rotation member 114 are disposed in the processing volume 106. Both the pedestal 108 and the rotation member 114 may be moveably disposed within the chamber 100. A gas source 116 and an RF power source 118 may also be coupled to the chamber 100.

The processing chamber 100 may be a plasma enhanced chemical vapor deposition (PECVD) chamber or other plasma enhanced processing chamber. An exemplary processing chamber which may benefit from the embodiments described herein is the PRODUCER® series of PECVD enabled chambers, available from Applied Materials, Inc., Santa Clara, Calif. It is contemplated that other similarly equipped processing chambers from other manufacturers may also benefit from the embodiments described herein.

The chamber body 102 includes a base 128 and an opening 124. The opening 124 may be formed in the chamber body 102 to allow for ingress and egress of a substrate 110 from the processing volume 106. A slit valve (not shown) may be coupled to the chamber body 102 adjacent the opening 124 to seal the processing volume 106. The chamber body 102 may also be coupled to a transfer chamber 126, or platform, adjacent the opening 124. In operation, a robot blade (not shown) or substrate handling apparatus may transfer the substrate 110 from the transfer chamber 126 to the processing chamber 100 so that the substrate 110 may be processed. Processed substrates 110 may be transferred from the processing chamber 100 through the opening 124 by the robot blade for subsequent processing operations.

The faceplate 104 is coupled to the gas source 116 and the RF power source 118. The faceplate 104 may be formed from an electrically conductive material, such as aluminum. The gas source 116 is configured to deliver processing gases via the faceplate 104 to the processing volume 106. Examples of suitable processing gases include Group III, Group IV, Group V precursors, and combinations thereof. The gas source 116 may also deliver carrier gases and inert gases to the processing volume 106. The RF power source 118 is configured to deliver RF energy to the faceplate 104. The RF energy, for example, 13.56 MHz RF energy, energizes processing gases provided from the gas source 116 to form a plasma in the processing volume 106. In one embodiment, the RF power source 118 may be configured to form a capacitively coupled plasma in the processing volume 106. In this embodiment, the faceplate 104 may be powered and the pedestal 108 may be grounded. In another example, the faceplate 104 may be grounded and the pedestal 108 may be powered.

The pedestal 108 comprises a substrate supporting surface 140 and a stem 138. The pedestal may be formed from a metallic or ceramic material, for example, aluminum or aluminum nitride. In one embodiment, the substrate supporting surface 140 may be configured to support the substrate 110 during processing. In another embodiment, the substrate supporting surface 140 may be configured to support an edge ring 112 during processing. The stem 138 extends through the base 128 of the chamber body 102 and may be coupled to a power source 122 which is configured to move the pedestal 108 axially along an axis 148. A heater 136 may also be disposed within the pedestal 108 and the heater 136 may be configured to heat the substrate 110 during processing. Although shown in an elevated processing position, the pedestal 108 may be lowered to receive the substrate 110 through the opening 124. Thus, when the pedestal 108 is in a lowered position, the substrate supporting surface 140 may be co-planar with the opening 124 or slightly below the opening 124.

One or more lift pins 130 may be coupled to the pedestal 108. The lift pins 130 may be formed from a ceramic material having a coefficient of thermal expansion similar to the coefficient of thermal expansion of the material forming the pedestal 108. The lift pins 130 are configured to extend through the pedestal 108 above the substrate supporting surface 140 to receive the substrate 110 from the robot blade when the pedestal 108 is in the lowered position.

The lift pins 130 comprise a contact member 132 and an actuator 134. In operation, the actuator 134 may engage the rotation member 114 when the pedestal 108 is in the lowered position and cause the contact member 132 to extend through the pedestal 108 beyond the substrate supporting surface 140 (shown in greater detail in FIG. 2A). In one embodiment, the actuator 134 may be weighted to retract the contact member 132 below the substrate supporting surface 140 when the pedestal 108 in the elevated position.

As previously mentioned, the rotation member 114 is moveably disposed in the chamber 100. Similar to the pedestal 108, the rotation member 114 may be configured to move axially along the axis 148. The rotation member 114 may also rotate about the axis 148. For example, the rotation member 114 may rotate around the stem 138 of the pedestal 108. The rotation member 114 may extend through the base 128 of the chamber body 102 adjacent the stem 138. A motor 120 may be coupled to the rotation member 114 and the motor 120 may be configured to move the rotation member 114 axially and rotate the rotation member 114 about the axis 148. In one embodiment, the motor 120 may be a rotary servo motor or the like.

The rotation member 114 may include one or more extensions 146 which extend from the rotation member 114. The one or more extensions 146 may be discrete from one another and may be spaced apart to allow for passage of the robot blade between adjacent extensions 146 when the pedestal 108 is in the lowered position. The extensions 146 are configured such that the extensions 146 are disposed radially outward of the pedestal 108. In one embodiment, the rotation member 114 may comprise three extensions 146. In this embodiment, the extensions 146 may be equidistant from one another along a hypothetical circumference which includes the three extensions 146. However, it is contemplated that the rotation member 114 may include a greater or lesser number of extensions.

The rotation member 114 and the extensions 146 may be formed from a ceramic material, for example, silicon carbide, or a quartz material. The extensions 146 may be configured to contact the edge ring 112. The edge ring 112 may be formed from a ceramic material and may have an annular shape. The edge ring 112 may be configured to engage either the substrate supporting surface 140 of the pedestal 108 or the extensions 146 of the rotation member 114. In one embodiment, the pedestal 108 may have an annular ledge 147 formed along the circumference of the substrate supporting surface 140. The annular ledge 147 may be configured to couple to and support the edge ring 112 when the pedestal 108 is in the processing position. In this embodiment, a bottom surface 142 of the edge ring 112 may contact the annular ledge 147 or the substrate supporting surface 140. The substrate 100 may either be supported by a top surface 144 the edge ring 112 or the substrate supporting surface 140, or a combination of both the edge ring 112 and the substrate supporting surface 140.

The edge ring 112 may be sized to extend radially outward from the substrate supporting surface 140 of the pedestal 108. As such, a diameter of the edge ring 112 may be greater than a diameter of the substrate supporting surface 140. The edge ring 112 may also extend radially outward of the annular ledge 147. Thus, a portion of the bottom surface 142 of the edge ring 112 which extends radially beyond the pedestal 108 may be configured to engage the one or more extensions 146 of the rotation member 114.

In operation, the rotation member 114 may be raised such that the extensions 146 contact the edge ring 112 to raise the edge ring 112 from the pedestal 108. Thus, the substrate 110 disposed on the edge ring 112 may be elevated from the substrate supporting surface 140. Alternatively, the rotation member 114 may remain stationary and the pedestal 108 may be lowered from the processing position such that the edge ring 112 engages the extensions 146. In both examples, the edge ring 112, and the substrate 110 supported thereon, may be spaced from the pedestal 108. The elevation of the edge ring 112 from the pedestal 108 enables the rotation member 114 to rotate the substrate 110 relative to the pedestal 108 about the axis 148. Rotation of the rotation member 114 may be discrete or continuous and vertical motion of the rotation member 114 may be utilized to generate a gap having a distance between the edge ring 112 and the pedestal 108. Positioning of either the rotation member 114 or the pedestal 108 may be utilized to control the gap distance to influence deposition characteristics of various processes.

Figure 2A:
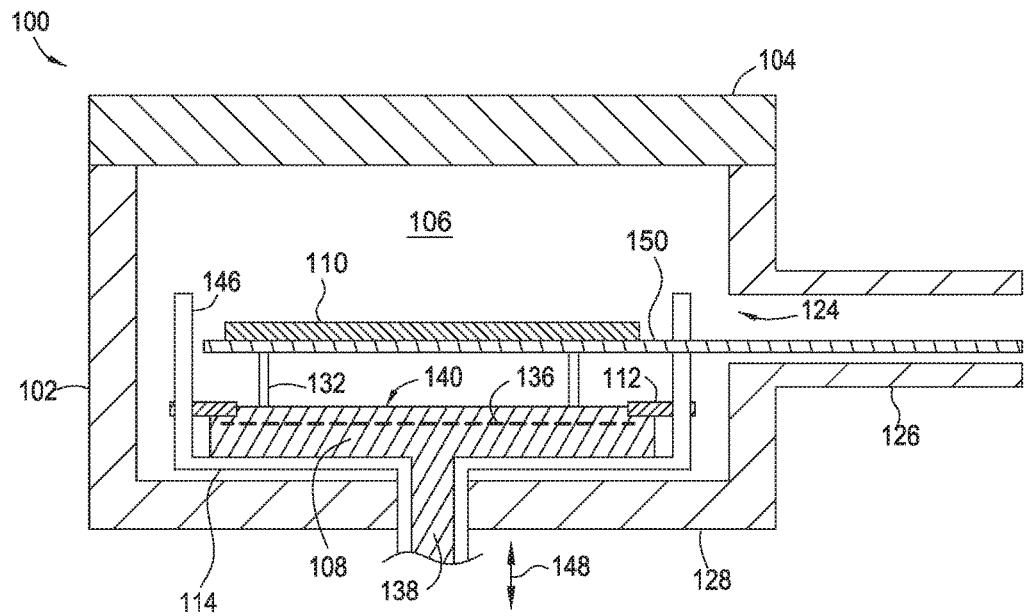
FIGS. 2A-2D illustrate the processing chamber of FIG. 1 during various substrate processing steps according to one embodiment.

FIGS. 2A-2D illustrate the processing chamber 100 of FIG. 1 during various substrate 110 processing operations. The gas source 116, RF power source, motor 120, and power source 122 are not shown in FIGS. 2A-2D so as to not obscure the embodiments described, however, it is contemplated that these elements may be included in the embodiments of FIGS. 2A-2D. FIG. 2A illustrates a robot blade 150 delivering the substrate 110 to the processing chamber 100. The robot blade 150 extends from the transfer chamber 126 through the opening 124 and positions the substrate 110 in the processing volume 106. The extensions 146 of the rotation member 114 may be positioned to allow for unobstructed passage of the robot blade 150. The contact members 132 of the lift pins 130 are shown extending above the substrate supporting surface 140 to receive the substrate 110 from the robot blade 150. The actuator 134 of the lift pins 130 may contact the rotation member 114 and cause the contact member 132 to extend through the pedestal 108 above the substrate supporting surface 140. In this embodiment, the rotation member 114 may be aligned with the lift pins 130 to enable lift pin 130 actuation when the pedestal 108 and rotation member 114 are in close proximity.

Figure 2B:
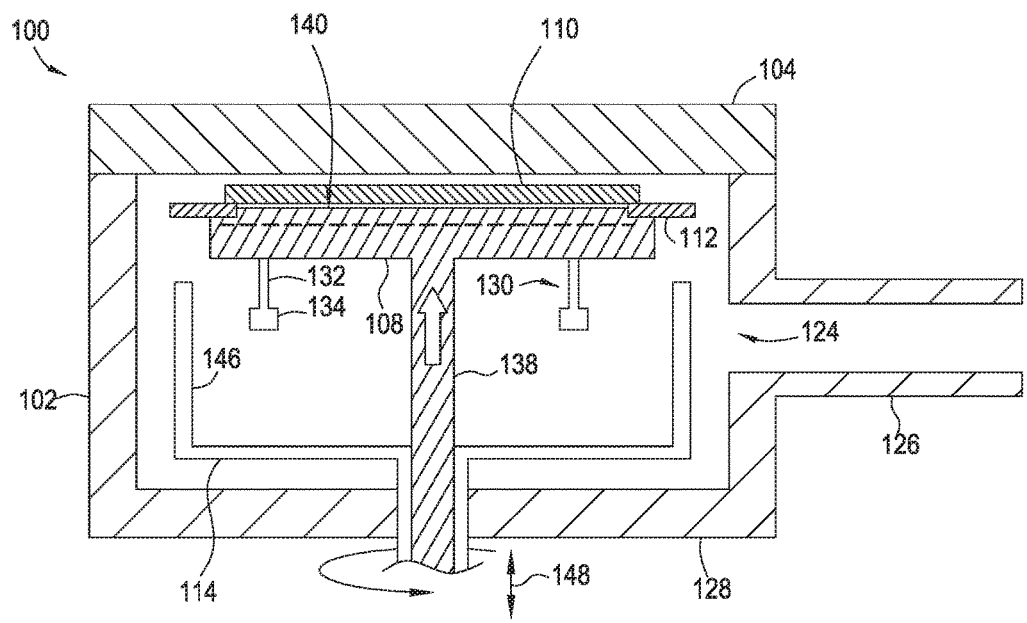

After the robot blade 150 has placed the substrate 110 on the lift pins 130, the robot blade 150 may retract from the processing volume 106. FIG. 2B illustrates the pedestal 108 being elevated to the processing position. The rotation member 114 may rotate about the axis 148 to a position (illustrated in FIG. 2C) adapted to elevate the substrate 110 in a subsequent operation. As illustrated, the lift pins 130 are disengaged from the rotation member 114 and the substrate 110 is resting on the edge ring 112. In one embodiment, the substrate 110 may also contact the substrate supporting surface 140. In the processing position, the substrate 110 may be processed for a desired duration. For example, the substrate may be partially processed or completely processed in the processing position.

Figure 2C:
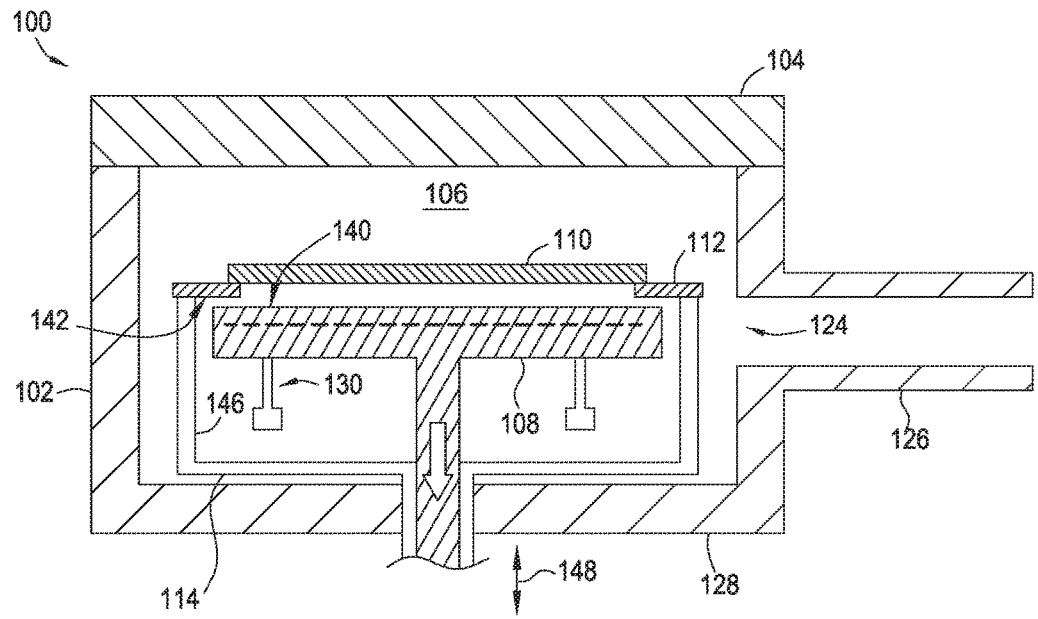

FIG. 2C illustrates operations for elevating the substrate 110 from the pedestal 108. During this operation, the pedestal 108 is lowered from the processing position such that the edge ring 112 contacts the extensions 146. The pedestal 108 may be lowered further to space the edge ring 112/substrate 110 from the substrate supporting surface 140. The pedestal 108 may be lowered by a distance great enough to engage the edge ring 112 on the extensions 146 but avoid contact between the lift pins 130 and the rotation member 114. As a result, the substrate is completely decoupled from the pedestal 108 and the extensions 146 solely support the edge ring 112 upon which the substrate 110 is disposed.

Figure 2D:
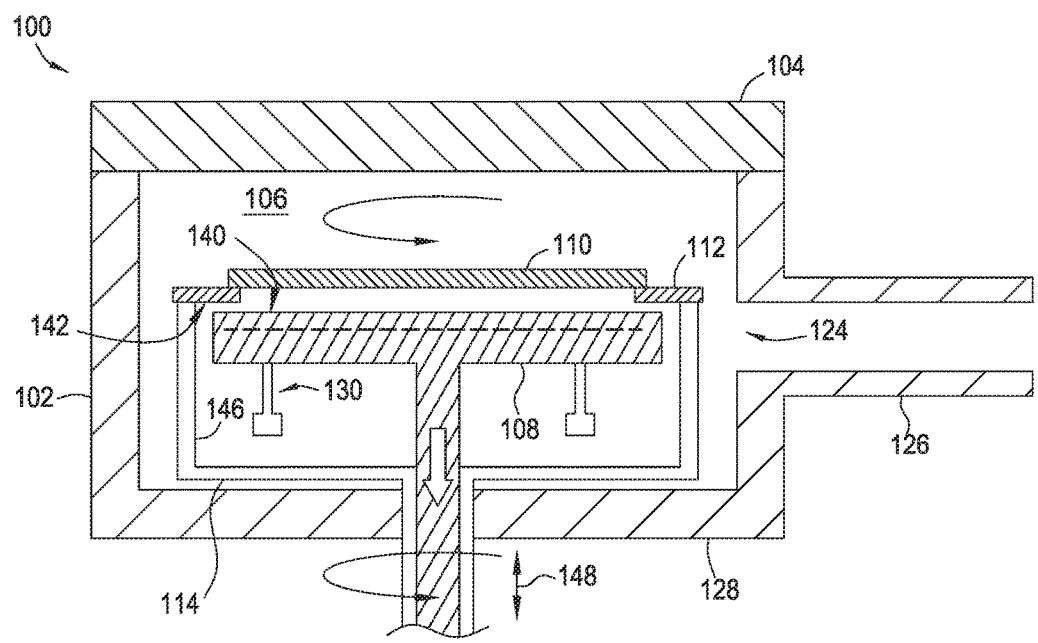

FIG. 2D illustrates rotation of the substrate 110 via the rotation member 114. As previously described, the edge ring 112 is decoupled from the pedestal 108 and the rotation member 114 may rotate about the axis 148 to rotate the substrate 110. The rotation of the substrate 110 changes the position of the substrate 110 relative to the faceplate 104 and the pedestal 108. In one embodiment, the rotation member 114 may rotate about the axis 148 between about 1° and about 360°, such as between about 30° and about 270°, for example, between about 90° and about 180°. In the embodiments described with regard to FIGS. 2A-2D, the rotation member 114 may maintain a single elevation within the processing volume 106 throughout the operations described.

Processing of the substrate 110 may proceed by repeating the embodiments described in FIGS. 2B-2D until a satisfactory film has been formed on the substrate. The substrate 110 may then be removed from the chamber 100 utilizing the embodiments described with regard to FIG. 2A. The above embodiments provide for discrete rotation of the substrate 110 during processing. In one embodiment, the substrate 110 may be rotated about 90° and processed four times such that deposition on the substrate 110 is performed when the substrate 110 is in four distinct orientations relative to the faceplate 104.

Figure 3A:
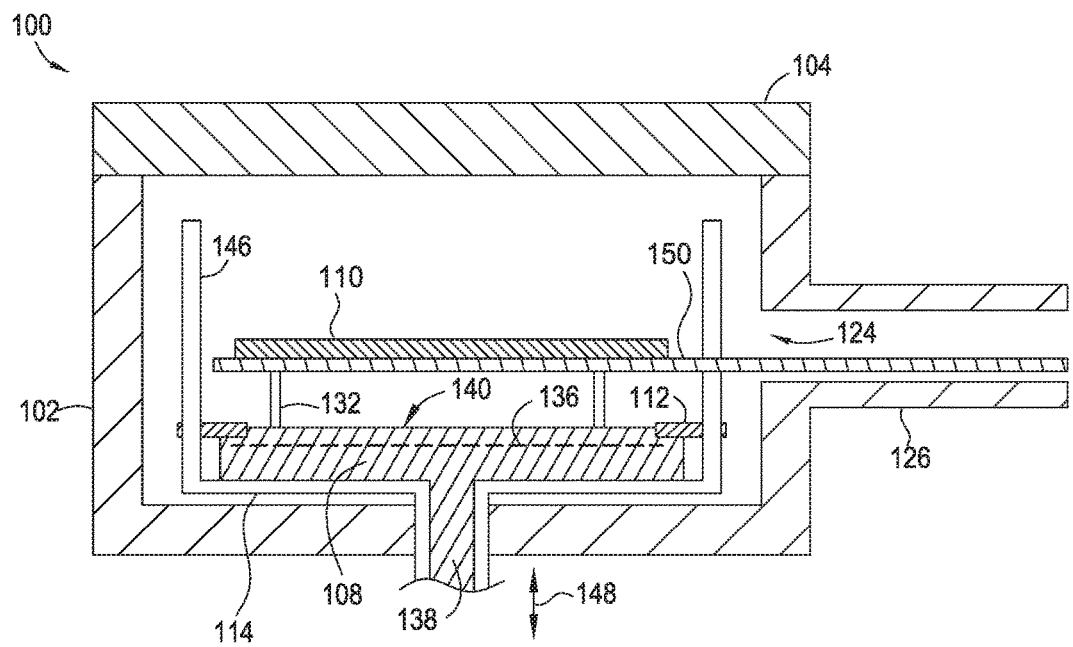
FIGS. 3A-3C illustrate the processing chamber of FIG. 1 during various substrate processing steps according to one embodiment
Figure 3B:
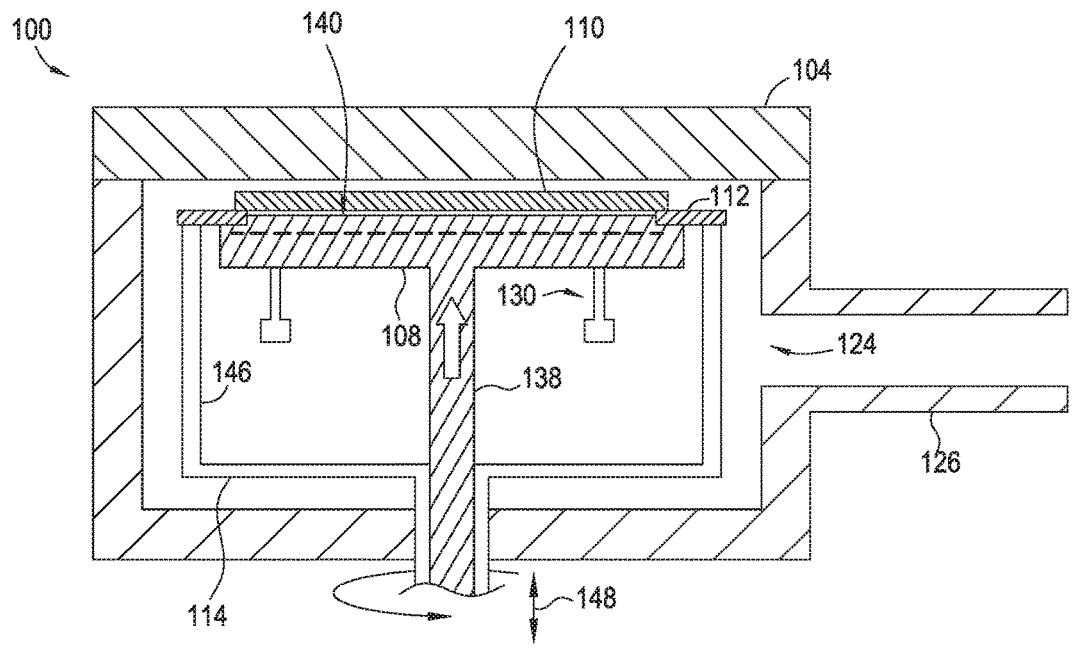
Figure 3C:
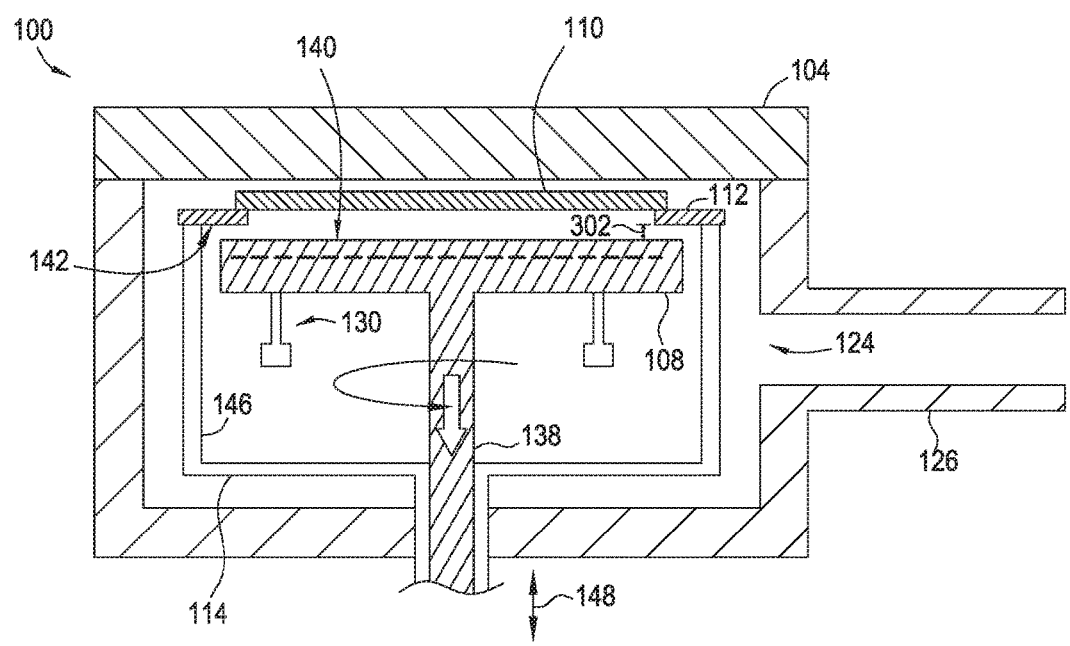

FIGS. 3A-3C illustrate the processing chamber 100 of FIG. 1 during various substrate processing operations. In the embodiments described with regard to FIGS. 3A-3C, the substrate 110 is continuously rotated during deposition of a film. FIGS. 3A and 3B are similar to FIGS. 2A and 2B, respectively, the description of which may be found above. In FIG. 3B, the extensions 146 may or may not be in contact with the edge ring 112. However, the edge ring 112 remains supported by the pedestal 108.

From the elevated processing position illustrated in FIG. 3B, the pedestal 108 is lowered a distance 302 such that the extensions 146 contact and support the edge ring 112. Thus, the substrate 110 and edge ring 112 are decoupled from the substrate supporting surface 140. The distance 302 may also define the spaced apart relationship between the substrate supporting surface 140 and the bottom surface of the edge ring 112. In one embodiment, the distance 302 may be between about 0.01 inches and about 1 inch. Alternatively, the distance 302 may define the spaced apart relationship between the substrate 110 and the substrate supporting surface 140.

Lowering the pedestal 108 and decoupling the edge ring 112/substrate 110 enables the rotation member 114 to rotate the edge ring 112/substrate 110 about the axis 148. Deposition of a film on the substrate 110 may proceed while the rotation member 114 is rotating the edge ring 112/substrate 110. The rotation of the rotation member 114 may continue for the entire duration of the deposition process or a portion of the deposition process. The spaced apart relationship between the edge ring 112/substrate 110 not only allows for rotation during deposition, but also maintains the capability of the pedestal 108 to heat the substrate 110 as a result of the close proximity between the substrate supporting surface 140 and the substrate 110.

Figure 4:
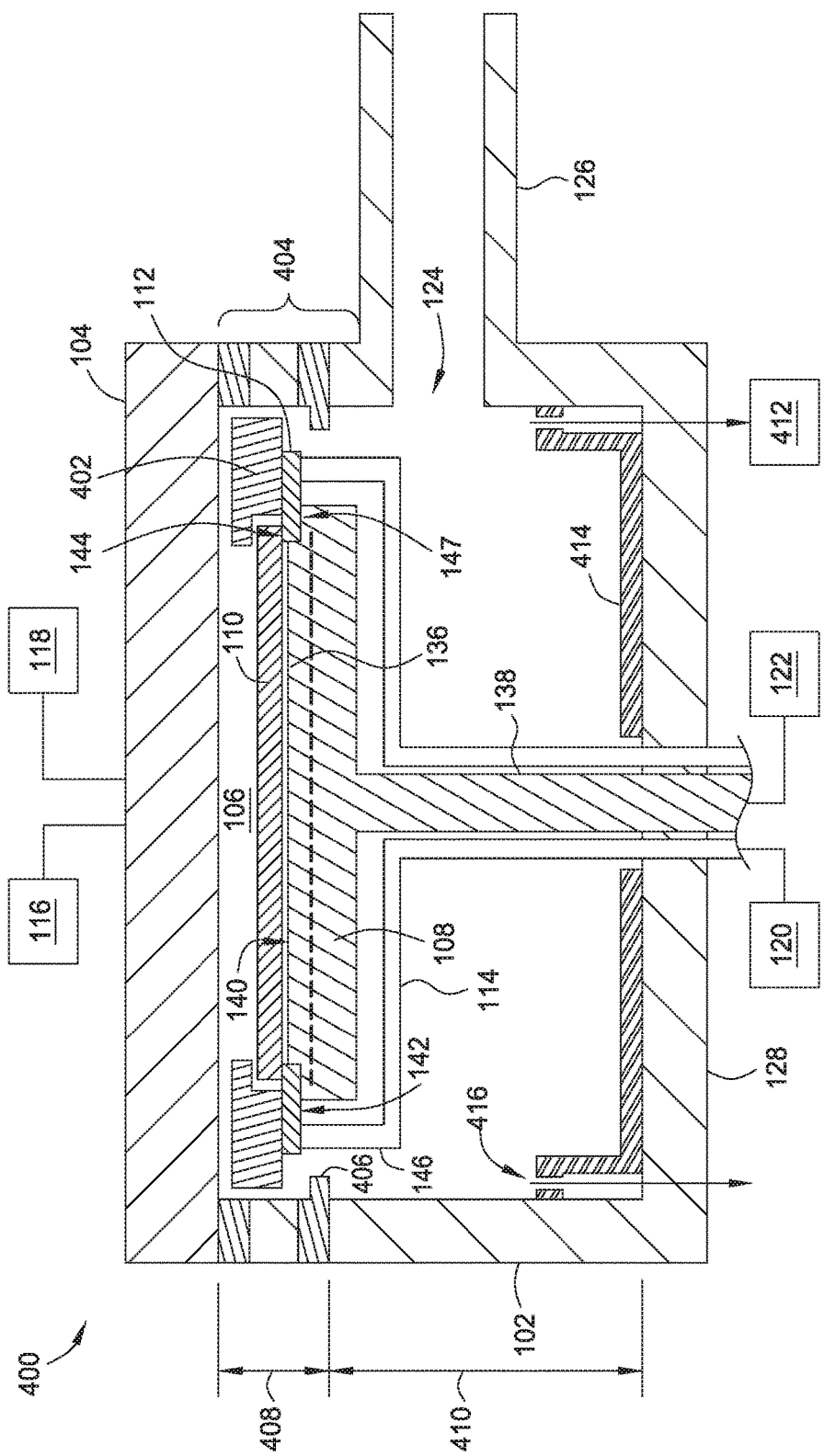
FIG. 4 illustrates a schematic, cross-sectional view of a processing chamber according to one embodiment.

FIG. 4 illustrates a schematic, cross-sectional view of a processing chamber 400. The chamber 400 may be similar to the chamber 100 described with regard to FIG. 1 and it is contemplated that embodiments described with regard to the chamber 400 may be utilized in the chamber 100 and vice versa. For example, although not shown in FIG. 4, the lift pins 130 of the chamber 100 may be utilized in the chamber 400. The chamber 400 may additionally include a shadow ring 402, an electrode 404, and a liner 414. The shadow ring 402 may be formed from a ceramic material similar to the material utilized to form the edge ring 112. The shadow ring 402 may be disposed on the top surface 144 of the edge ring 112 or an electrode extension 406, depending on positions of the pedestal 108 and the rotation member 114. The shadow ring 402 may be annular in shape and a portion of the shadow ring 402 may extend over an edge of the substrate 110 to prevent deposition near the edge of the substrate 110. In one embodiment, the shadow ring 402 may be optional.

The electrode 404 may be coupled to the chamber body 102 adjacent the faceplate 104 and be configured to influence a plasma formed above the substrate 110 in the processing volume 106. The electrode 404 may generate an electrical current which affects the shape, density, and various other characteristics of the plasma to influence film deposition on the substrate 110. The electrode extension 406 may extend radially inward from the chamber body 102 and be configured to support the shadow ring 402 when the shadow ring is not supported by the edge ring 112 (See FIGS. 5A-5B).

The liner 414 comprises a ceramic plate which is coupled to the base 128 of the chamber body 102. The liner 414 may be utilized to prevent RF coupling to the base 128 and may also improve the efficiency of cleaning and maintenance procedures performed on the chamber 400. A liner port 416 may be formed through the liner 414. A pump 412 may also be coupled to the chamber 400 such that the pump 412 is in fluid communication with the processing volume 106. The pump 412 may exhaust the processing volume 106 via the liner port 416 and generate a vacuum within the chamber 400.

An upper region 408 of the processing volume 106 may be approximately defined as the distance between the substrate supporting surface 140 and the faceplate 104. The upper region 408 distance may be between about 0.2 inches and about 3 inches, such as between about 0.75 inches and about 1.25 inches, for example, 1 inch. A lower region 410 of the processing volume 106 may be approximately defined as the distance between the substrate supporting surface 140 and the base 128 or liner 414. The lower region 410 distance may be between about 1 inch and about 4 inches, such as between about 1.5 inches and about 2.5 inches, for example, 2 inches. In one embodiment, the lower region 410 comprises approximately 50% of the processing volume 106.

Figure 5A:
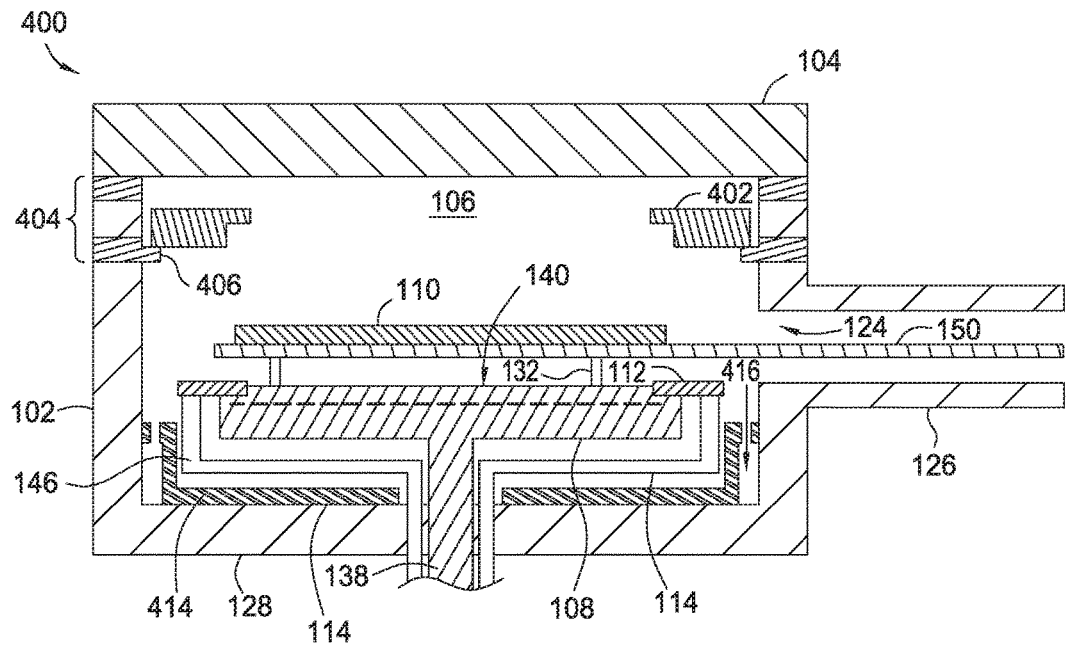
FIGS. 5A-5F illustrate the processing chamber of FIG. 4 during various substrate processing steps according to one embodiment.

FIGS. 5A-FH illustrate the processing chamber 400 of FIG. 4 during various substrate processing operations. The gas source 116, RF power source, motor 120, and power source 122 are not shown in FIGS. 5A-5F so as to not obscure the embodiments described, however, these it is contemplated that these elements may be included in the embodiments of FIGS. 5A-5F. Additionally, lift pins 130 may be coupled to the pedestal 108 but are not shown for the sake of clarity.

Figure 5B:
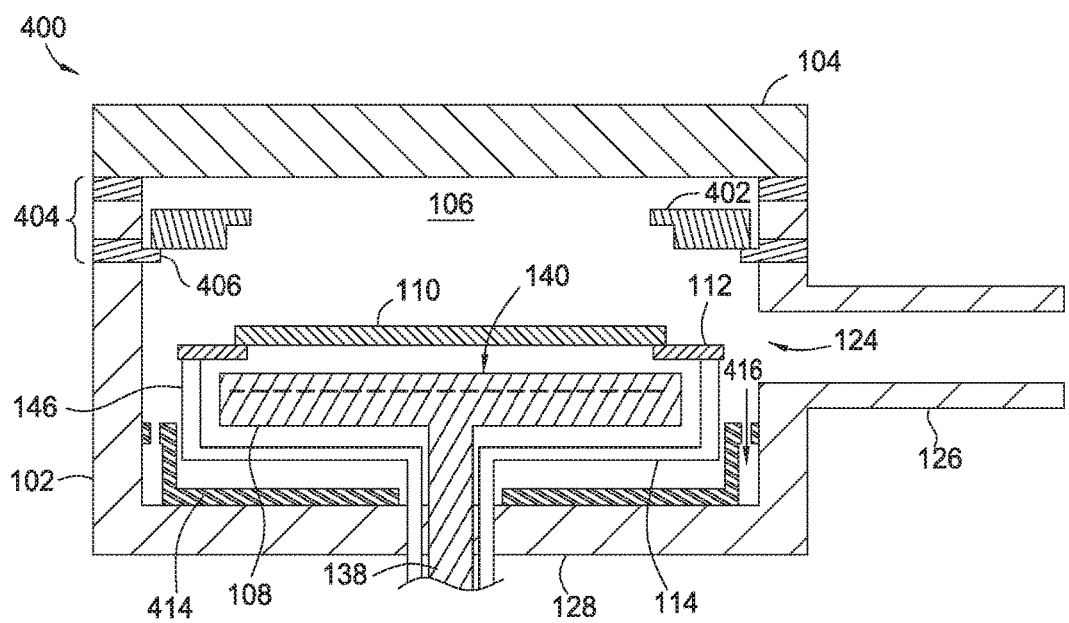

FIG. 5A is similar to FIGS. 2A and 3A, the description of which may be found above. When the rotation member 114 is in a lowered position, the extensions 146 may remain below a plane of travel of the robot blade 150 to allow for unobstructed delivery of the substrate 110 to the processing volume 106. In one embodiment, the length of the extensions 146 illustrated in FIGS. 4 and 5A-5F may be less than the length of the extensions 146 illustrated in FIG. 1, FIGS. 2A-2D, and FIGS. 3A-3C. FIG. 5B illustrates the rotation member 114 in a slightly raised position where the extensions 146 contact the edge ring 112 to elevate the substrate 110 above the pedestal 108.

Figure 5C:
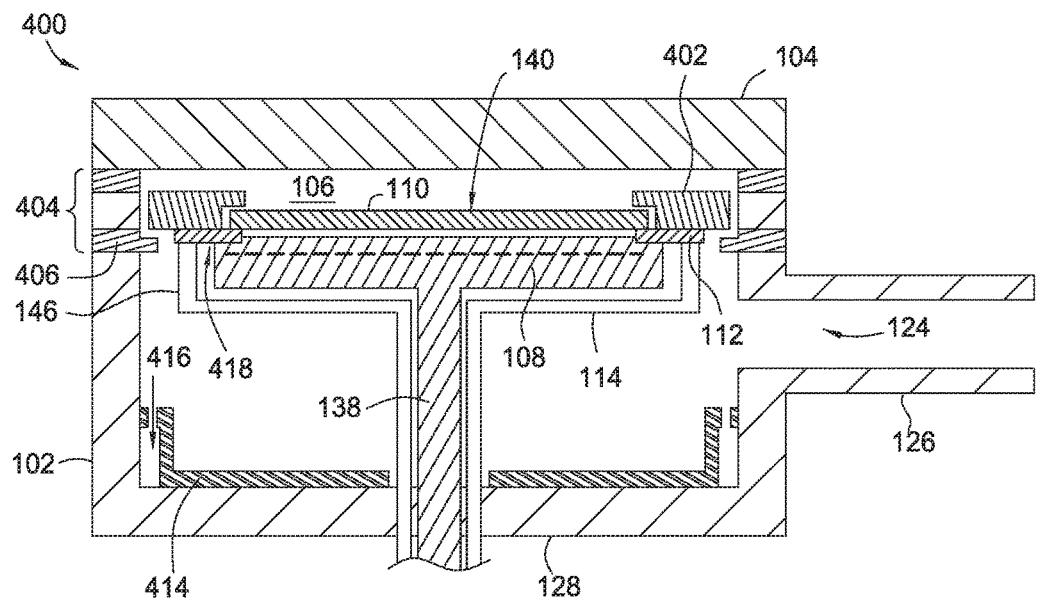

FIG. 5C illustrates the pedestal 108 and the rotation member 114 in elevated processing positions. The pedestal 108 and rotation member 114 may be raised together with either the rotation member 114 supporting the edge ring 112 or the pedestal 108 supporting the edge ring 112. As illustrated, when the substrate is positioned in the final processing position, the edge ring 112 may be disposed on the substrate supporting surface 140 or the annular ledge 147. The extensions 146 may remain in contact with the edge ring 112 or may be lowered out of contact with the edge ring 112 but the edge ring 112 will be supported by the pedestal 108 in most embodiments. With the substrate 110 in the elevated processing position, deposition of at least a portion of a film may proceed. In one embodiment, about one fourth of the desired film thickness may be deposited.

Figure 5D:
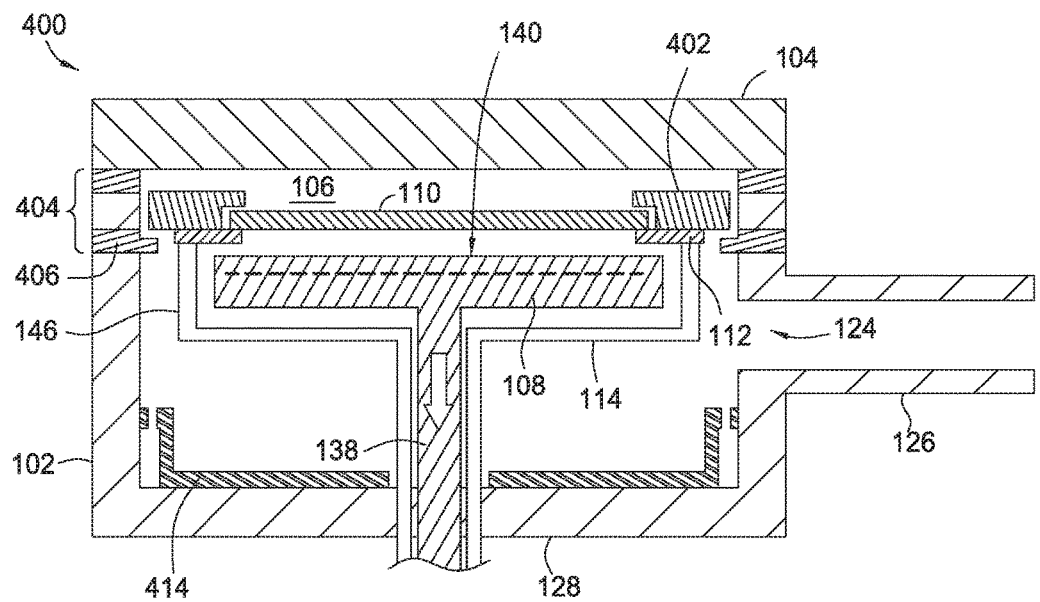

FIG. 5D illustrates separation of the edge ring 112/substrate 110 from the pedestal 108. The pedestal 108 is lowered but the rotation member 114 remains in the position illustrated in FIG. 5C or, in one embodiment, the rotation member 114 may be raised. In either embodiment, the edge ring 112/substrate 110 is spaced from the substrate supporting surface 140.

Figure 5E:
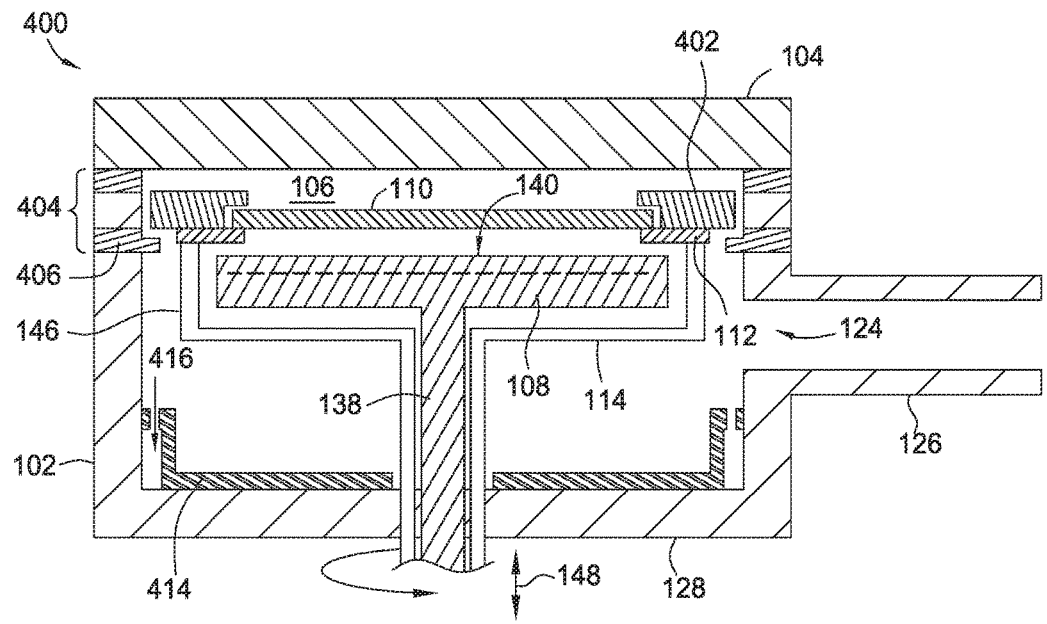

FIG. 5E illustrates rotation of the edge ring 112/substrate 110 by the rotation member 114. After the edge ring 112/substrate 110 has been spaced from the pedestal, the rotation member 114 may rotate about the axis 148. In one embodiment, the rotation member 114 may rotate between about 60° and about 120°, such as about 90°.

Figure 5F:
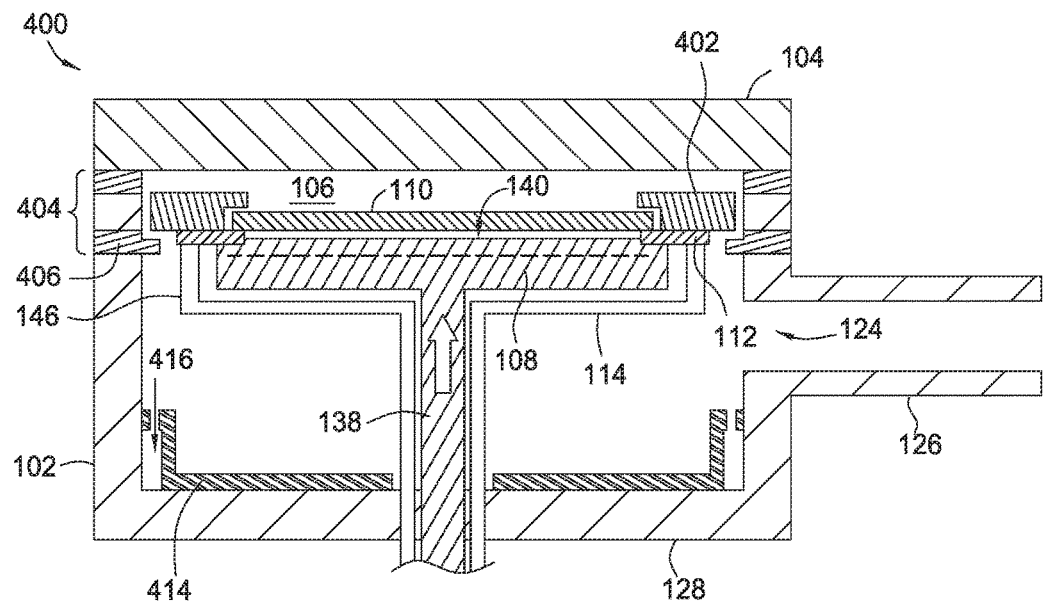

FIG. 5F illustrates the pedestal 108 raising to the processing position. As illustrated, the pedestal 108 may be elevated to contact the edge ring 112/substrate 110. It is contemplated that the rotation member 114 may also be lowered slightly to reengage contact between the pedestal and the edge ring 112/substrate 110. The positions of the pedestal 108 and the rotation member 114 in this embodiment are similar to the positions of the pedestal 108 and the rotation member 114 illustrated in FIG. 5C. Deposition of a portion of the film may proceed as described above.

The processes described with regard to FIGS. 5D-5F may be repeated until a desired film thickness is achieved. In one embodiment, the edge ring 112/substrate 110 may be rotated by about 90° four times with one fourth of a desired film thickness deposited between each rotation. For example, a second position of the substrate 110 may be rotated by about 90° from a first position of the substrate 110. A third position of the substrate 110 may be rotated by about 90° from the second position of the substrate 110. A fourth position of the substrate 110 may be rotated by about 90° from the third position of the substrate 110. The first position, second position, third position, and fourth position may be different from one another. It is believed that rotation of the substrate 110 relative to the faceplate 104 and the pedestal 108 may improve the thickness uniformity of the deposited film across the surface of the substrate 110.

After the film has been deposited to a desired thickness, the pedestal 108 and rotation member 114 may be co-lowered to the position illustrated in FIG. 5A. From this position, the substrate 110 may be removed from the chamber 400 and the process may be repeated for another substrate. The rotation member 114 described in FIG. 4 and FIGS. 5A-5F may move axially as well as rotationally. The process described in FIGS. 5A-5F illustrates a discrete rotation and deposition process, however, it is contemplated that the deposition and rotation process may be continuous, for example, similar to the embodiments described with regard to FIGS. 3A-3C. As utilized herein, a discrete rotation and deposition process may be defined as depositing a portion of a film, stopping the deposition and rotating the substrate, and resuming deposition after the substrate has been rotated. In a continuous rotation and deposition process, deposition on the substrate proceeds while the substrate is being rotated.

The embodiments described herein provide for improved film thickness uniformity across the surface of the substrate in PECVD enabled chambers. It is contemplated that other types of semiconductor processing chamber may benefit from the embodiments described herein. The substrate may be decoupled from the pedestal by edge ring to allow the rotation member to rotate the edge ring and substrate within the processing volume. The rotation may be discrete or continuous and the deposition of the film may be either discrete or continuous. Individual embodiments described herein may be combined with other embodiments to realize improvements in film thickness uniformity. Thus, forming films having improved thickness uniformity profiles may provide for improved semiconductor devices.

While the foregoing is directed to embodiments of the present disclosure, other and further embodiments of the disclosure may be devised without departing from the basic scope thereof, and the scope thereof is determined by the claims that follow.

The invention claimed is:

1. A method of processing a substrate, comprising:
depositing a first portion of a film on a substrate in a first position;
stopping the deposition of the first portion of the film;
engaging a rotation member to rotate the substrate from the first position to a second position different from the first position; and
depositing a second portion of the film on the substrate in the second position.

2. The method of claim 1, further comprising:
stopping the deposition of the second portion of the film;
engaging the rotation member to rotate the substrate from the second position to a third position different from the first position and the second position;
depositing a third portion of the film on the substrate in the third position;
stopping the deposition of the third portion of the film;
engaging the rotation member to rotate the substrate from the third position to a fourth position different from the first position, the second position, and the third position; and
depositing a fourth portion of the film on the substrate in the fourth position.

3. The method of claim 2, wherein an elevation of the rotation member in each of the first position, the second position, the third position, and the fourth position is the same.

4. The method of claim 3, wherein the second position is about 90° from the first position.

5. The method of claim 3, wherein the third position is about 90° from the second position.

6. The method of claim 3, wherein the fourth position is about 90° from the third position.

7. The method of claim 1, wherein the substrate is disposed on an edge ring.

8. The method of claim 7, wherein the engaging the rotation member to rotate the substrate further comprises:
lowering a pedestal out of contact with an edge ring; and
rotating the rotation member.

9. The method of claim 1, wherein the substrate is disposed on a pedestal during the depositing a first portion of the film and the depositing a second portion of the film.

10. The method of claim 1, wherein the substrate is supported by an edge ring during the rotating the substrate.

11. A method of processing a substrate, comprising:
contacting an edge ring disposed in a process chamber with a pedestal;
elevating the pedestal and the edge ring to a processing position;
depositing a film on a substrate, wherein the substrate is disposed on the edge ring located in the processing position during the deposition;
contacting the edge ring with a rotation member and lowering the pedestal from the processing position, wherein the edge ring is spaced from the pedestal when the pedestal is lowered; and
rotating the rotation member while in contact with the edge ring.

12. The method of claim 11, wherein the lowering the pedestal comprises decoupling the pedestal from the edge ring by a distance of between about 0.01 inches and about 1 inch.

13. The method of claim 11, wherein the depositing a film on the substrate and the rotating the rotation member are performed sequentially.

14. The method of claim 11, wherein the depositing a film on the substrate and the rotating the rotation member are performed simultaneously.

15. The method of claim 11, further comprising:
heating the substrate during the depositing a film on the substrate via a heater disposed in the pedestal.

16. A method of processing a substrate, comprising:
engaging an edge ring disposed in a process chamber with a rotation member;
elevating the rotation member to engage a shadow ring with the edge ring;
elevating a pedestal to engage the edge ring having the shadow ring disposed thereon;
performing a deposition process while the edge ring is disposed on the pedestal;
disengaging the pedestal from the edge ring by lowering the pedestal;
rotating the rotation member to rotate the edge ring and the shadow ring; and
reengaging the edge ring by elevating the pedestal to contact the edge ring.

17. The method of claim 16, wherein the shadow ring is supported by an electrode when the edge ring is disengaged from the shadow ring.

18. The method of claim 16, wherein the performing a deposition process and the rotating the rotation member are performed sequentially.

19. The method of claim 16, wherein the performing a deposition process and the rotating the rotation member are performed simultaneously.

20. The method of claim 16, wherein the edge ring and the shadow ring are rotated between about 30° and about 270° during rotation of the rotation member.

* * * * *